United States Patent
Ok et al.

(10) Patent No.: US 10,210,948 B2
(45) Date of Patent: Feb. 19, 2019

(54) BUILT-IN SELF-TEST (BIST) CIRCUIT, MEMORY DEVICE INCLUDING THE SAME, AND METHOD OF OPERATING THE BIST CIRCUIT

(71) Applicant: Samsung Electronics Co., Ltd., Suwon-si (KR)

(72) Inventors: Seung-ho Ok, Yongin-si (KR); Pyung-moon Zhang, Yongin-si (KR); Sang-hoon Shin, Yongin-si (KR); Ki-hyun Park, Seoul (KR); Yong-sik Park, Anyang-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 60 days.

(21) Appl. No.: 15/262,027

(22) Filed: Sep. 12, 2016

(65) Prior Publication Data
US 2017/0162276 A1 Jun. 8, 2017

(30) Foreign Application Priority Data
Dec. 4, 2015 (KR) .......................... 10-2015-0172660

(51) Int. Cl.
*G11C 29/00* (2006.01)
*G11C 29/38* (2006.01)
(Continued)

(52) U.S. Cl.
CPC .............. *G11C 29/38* (2013.01); *G11C 29/36* (2013.01); *G11C 29/50012* (2013.01); *G11C 2029/3602* (2013.01); *G11C 2029/5004* (2013.01)

(58) Field of Classification Search
CPC ..... G01R 31/28; G01R 31/3177; G06F 17/50; G11C 2029/3602; G11C 2029/5004;
(Continued)

(56) References Cited

U.S. PATENT DOCUMENTS 6,108,798 A * 8/2000 Heidel ................. G11C 29/028
711/105
6,658,611 B1 * 12/2003 Jun ........................ G11C 29/16
365/201
(Continued)

OTHER PUBLICATIONS

Bernadi et al., "A Programmable BIST for DRAM testing and diagnosis." IEEE International Test Conference 1, 978-1-4244-7207-9/10, 2010.
(Continued)

*Primary Examiner* — Guy J Lamarre
*Assistant Examiner* — Enamul M Kabir
(74) *Attorney, Agent, or Firm* — Muir Patent Law, PLLC

(57) ABSTRACT

A built-in self-test (BIST) circuit and a method of operating BIST circuit is disclosed. The BIST circuit is configured to generate a test pattern based on a plurality of test parameters and perform a test on at least one memory core. The method includes setting a sweep range including a sweep start point of a first test parameter and a sweep end point thereof; generating a first test pattern corresponding to each sweep point of the sweep range from the sweep start point of the first test parameter and the sweep end point thereof and providing the first test pattern to the at least one memory core; receiving output data corresponding to the first test pattern from the at least one memory core and comparing the output data and a predetermined reference data; and generating first test result information based on results of the comparing.

19 Claims, 17 Drawing Sheets

(51) Int. Cl.
*G11C 29/36* (2006.01)
*G11C 29/50* (2006.01)

(58) Field of Classification Search
CPC ......... G11C 29/00; G11C 29/36; G11C 29/38;
G11C 29/50012
See application file for complete search history.

(56) References Cited

U.S. PATENT DOCUMENTS

| | | | |
|---|---|---|---|
| 6,691,055 B2 | 2/2004 | Walter et al. | |
| 6,728,916 B2 | 4/2004 | Chen et al. | |
| 7,437,591 B1* | 10/2008 | Wong | G01R 31/31919 713/500 |
| 7,472,320 B2* | 12/2008 | Berndlmaier | G01R 31/31707 714/704 |
| 7,777,545 B2 | 8/2010 | Takahashi | |
| 8,060,785 B2 | 11/2011 | Lin et al. | |
| 8,793,547 B2 | 7/2014 | Loh et al. | |
| 8,832,511 B2 | 9/2014 | Chen et al. | |
| 8,853,847 B2 | 10/2014 | Gorman et al. | |
| 2002/0031025 A1* | 3/2002 | Shimano | G11C 29/44 365/201 |
| 2003/0167144 A1* | 9/2003 | Wang | G06F 11/2242 702/119 |
| 2004/0059536 A1* | 3/2004 | Chang | G01R 31/31919 702/120 |
| 2004/0249605 A1* | 12/2004 | Komatsu | G01R 27/28 702/182 |
| 2007/0236498 A1* | 10/2007 | Higuchi | G06T 11/00 345/441 |
| 2009/0327824 A1* | 12/2009 | Alaniz | G01R 31/3187 714/732 |
| 2010/0127729 A1* | 5/2010 | Zjajo | G01B 31/31855 324/750.3 |
| 2010/0131221 A1* | 5/2010 | Chien | G11C 29/02 702/81 |
| 2013/0200931 A1* | 8/2013 | Kono | G01R 31/31726 327/150 |
| 2014/0032826 A1* | 1/2014 | Lee | G06F 12/00 711/104 |
| 2014/0258797 A1* | 9/2014 | Gorman | G11C 29/40 714/719 |
| 2014/0355655 A1 | 12/2014 | Chakraborty | |
| 2015/0234603 A1 | 8/2015 | Kitagawa et al. | |
| 2016/0365156 A1* | 12/2016 | Busi | G11C 29/18 |

OTHER PUBLICATIONS

Boutobza et al., "Programmable Memory BIST." IEEE International Test Conference 0-7803-9039-3, 2005.

* cited by examiner

FIG. 3

|  | SELECTED PARAMETER | PARAMETER SWEEP RANGE (Clock Unit) |
|---|---|---|
| Loop1 | FIRST TEST PARAMETER | 5 ~ 10 |
| Loop2 | SECOND TEST PARAMETER | 10 ~ 20 |
| Loop3 | THIRD TEST PARAMETER | 20 ~ 25 |
| Loop4 | FOURTH TEST PARAMETER | 10 ~ 15 |

FIG. 5A

| SELECTED PARAMETER | TEST RESULT INFORMATION |
|---|---|
| FIRST<br>TEST PARAMETER<br>(SP_1) | [TRI 1]          M1<br>\| 1st RC Fail 5 \| 2nd RC Pass 6 \| 3rd RC Pass 7 \| 4th RC Pass 8 \| 5th RC Pass 9 \| 6th RC Pass 10 \| |
| SECONDTER<br>TEST PARAMETER<br>(SP_2) | [TRI 2]          M2<br>\| 1st RC Fail 10 \| 2nd RC Fail 11 \| 3rd RC Pass 12 \| ... \| 9th RC Pass 18 \| 10th RC Pass 19 \| 11th RC Pass 20 \| |
| THIRD<br>TEST PARAMETER<br>(SP_3) | [TRI 3]          M3<br>\| 1st RC Fail 20 \| 2nd RC Fail 21 \| 3rd RC Fail 22 \| 4th RC Fail 23 \| 5th RC Pass 24 \| 6th RC Pass 25 \| |
| FOURTH<br>TEST PARAMETER<br>(SP_4) | [TRI 4]<br>\| 1st RC Fail 10 \| 2nd RC Fail 11 \| 3rd RC Fail 12 \| 4th RC Fail 13 \| 5th RC Fail 14 \| 6th RC Fail 15 \|    M4 : X |

BUILT-IN SELF-TEST (BIST) CIRCUIT, MEMORY DEVICE INCLUDING THE SAME, AND METHOD OF OPERATING THE BIST CIRCUIT

CROSS-REFERENCE TO RELATED APPLICATION

This application claims the benefit of priority under 35 USC § 119 to Korean Patent Application No. 10-2015-0172660, filed on Dec. 4, 2015, in the Korean Intellectual Property Office, the disclosure of which is incorporated herein in its entirety by reference.

BACKGROUND

The example embodiments relate to a built-in self-test (BIST) circuit, and more particularly, to a BIST circuit, a memory device including the BIST circuit, and a method of operating the BIST circuit.

As semiconductor manufacturing technology develops, integration of semiconductor devices increases and simultaneously a possibility of failure of the semiconductor device may further increase. Thus, a process of catching a problem of a semiconductor manufacturing process is desired and may be performed by analyzing a failure that occurs in the semiconductor device.

For example, a memory device has been tested by using external dedicated equipment. However, significant changes have occurred with respect to a method of testing the memory device due to the advent of system on chip (SoC) technology that forms a system in a single chip. An SoC uses a plurality of built-in memory devices having a large width data I/O for improving performance. It may be inefficient to test such built-in memory devices by using the existing dedicated test equipment due to a lack of channel numbers, a limitation of a high speed test, and low accessibility to the built-in memory devices.

As an alternative to handling the problem, a method of including a BIST circuit in an SoC has been developed. The method is often used in the high speed test compared to the method using external dedicated equipment, and thus research has been carried out thereon. At present, a BIST method is widely used as a method of testing a built-in memory device currently included in the SoC.

SUMMARY

The example embodiments provide a built-in self-test (BIST) circuit capable of reducing a test time with respect to a memory core according to diverse environments using a memory device and tuning a memory characteristic of, for example, the memory core in accordance with a variable operating environment.

According to an aspect of the inventive concept, there is provided a method of operating a built-in self-test (BIST) circuit configured to generate a test pattern based on a plurality of test parameters including a first test parameter and a second test parameter and perform a test on at least one memory core, the method including setting a sweep range including a sweep start point of the first test parameter and a sweep end point of the first test parameter; generating a first test pattern corresponding to each sweep point of the sweep range from the sweep start point of the first test parameter and the sweep end point of the first test parameter and providing the first test pattern to the at least one memory core; receiving output data corresponding to first test pattern from the at least memory core and comparing the output data and a predetermined reference data; and generating first test result information based on results of the comparing.

According to another aspect of the inventive concept, there is provided a method of operating a BIST circuit configured to repeatedly perform a plurality of test loops for performing a sweep test on at least one memory chip, the method comprising: generating a test pattern by sweeping at least one test parameter based on a sweep range corresponding to at least one of a plurality of test parameters, wherein at least one of the plurality of test loops performs the step of generating said test pattern; generating test result information by testing the at least one memory chip by using the test pattern, wherein at least one of the plurality of test loops performs the step of generating said test result information; and tuning a memory characteristic of the at least one memory chip based on a plurality of pieces of test result information generated through the plurality of test loops, wherein at least one of the plurality of test loops performs the step of tuning said memory characteristic.

According to another aspect of the inventive concept, there is provided a built-in self-test (BIST) circuit configured to generate a test pattern based on a plurality of test parameters including a first test parameter and a second test parameter and perform a test on at least one memory core. The BIST circuit includes: a control circuit configured to set a sweep range comprising a sweep start point of the first test parameter and a sweep end point of the first test parameter; a pattern generating circuit configured to generate a first test pattern corresponding to each sweep point of the sweep range from the sweep start point of the first test parameter and the sweep end point of the first test parameter and configured to provide the first test pattern to the at least one memory core; a comparing circuit configured to receive output data corresponding to the first test pattern from the at least one memory core and configured to compare the output data received from the at least one memory core and a predetermined reference data received from the pattern generating circuit in order to generate a comparison result; and a storage circuit configured to generate first test result information based on the comparison result received from the comparing circuit.

BRIEF DESCRIPTION OF THE DRAWINGS

Embodiments of the inventive concept will be more clearly understood from the following detailed description taken in conjunction with the accompanying drawings in which:

FIG. 3 is a diagram of sweep parameter information for describing an operation of a BIST control logic according to an exemplary embodiment;

FIGS. 5A and 5B are diagrams for describing test result information generated through a sweep test according to an exemplary embodiment;

DETAILED DESCRIPTION OF THE EMBODIMENTS

Figure 1:
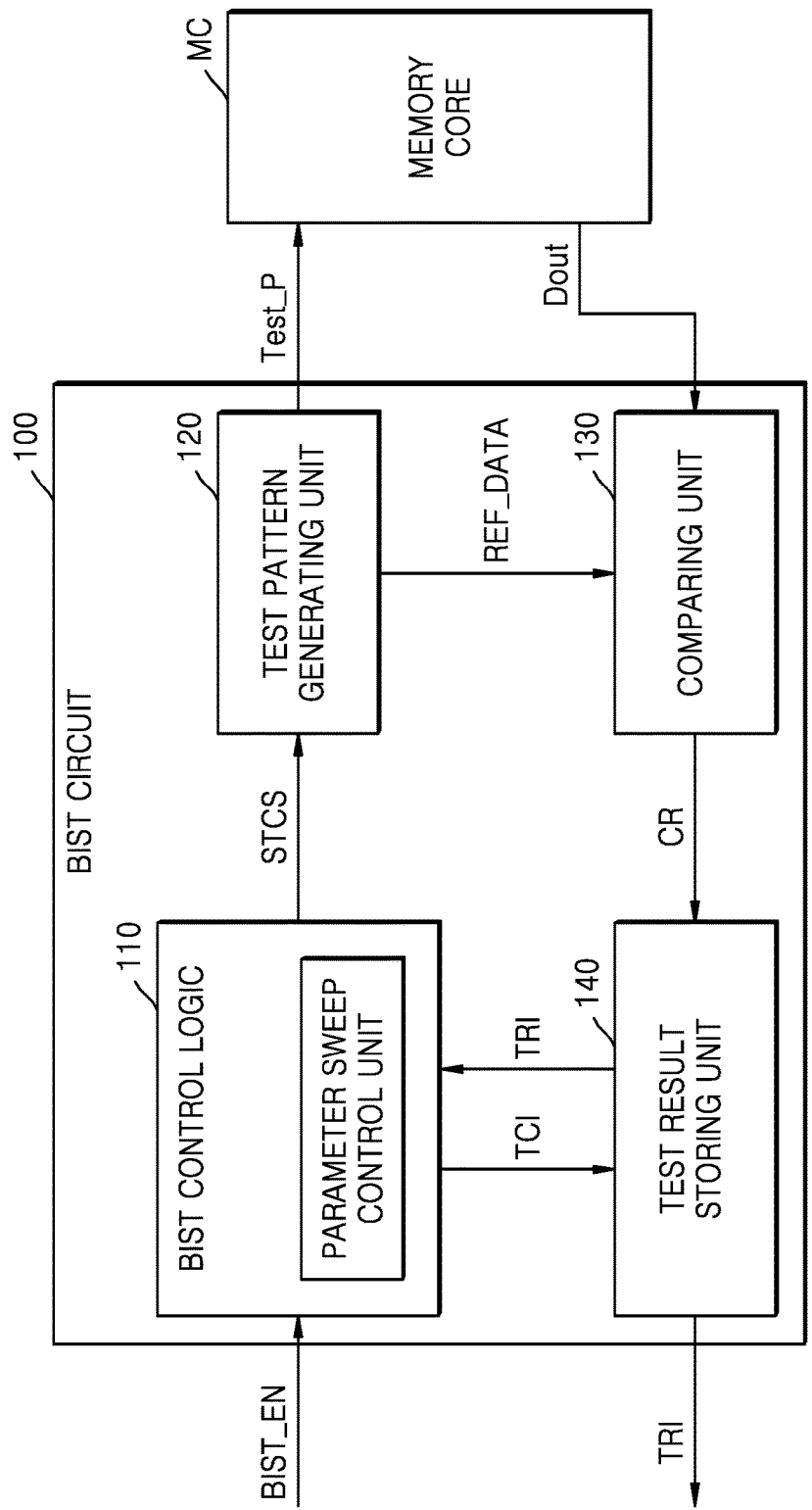
FIG. 1 is a block diagram of a built-in self-test (BIST) circuit according to an exemplary embodiment.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Unless otherwise defined, all terms (including technical and scientific terms) used herein have the same meaning as commonly understood by one of ordinary skill in the art to which this disclosure belongs.

FIG. 1 is a block diagram of a built-in self-test (BIST) circuit 100 according to an exemplary embodiment.

As shown in FIG. 1, the BIST circuit 100 may include a BIST control logic 110 (e.g., a control circuit), a test pattern generating unit 120 (e.g., a test pattern generating circuit), a comparing unit 130 (e.g., a comparing circuit), and a test result storing unit 140 (e.g., a test result storing circuit). The BIST circuit 100 may be built in a memory device and may test a memory core MC included in the memory device. The BIST circuit 100 may be a circuit implementing a memory test algorithm for testing the memory core MC. The BIST circuit 100 may test memory cells of the memory core MC capable of repairing a built-in defect of the memory core MC, may analyze a defect phenomenon, and may extract information for recovery. Defective memory cells of the memory core MC may be recovered based on the information. The memory core MC may be at least one of a non-volatile memory, a volatile memory, and a memory including both the non-volatile memory and the volatile memory.

In this exemplary embodiment, the BIST circuit 100 may include the BIST control logic 110, the test pattern generating unit 120, the comparing unit 130, and the test result storing unit 140. The BIST control logic 110 may receive a BIST enable signal BIST_EN from outside of the BIST circuit 100 and may control a test on the memory core MC in response to the BIST enable signal BIST_EN. According to an exemplary embodiment, the BIST control logic 110 may include a parameter sweep control unit 115 (e.g., a parameter sweep controller or a parameter sweep control circuit). The parameter sweep control unit 115 may set a sweep range of a plurality of test parameters. For example, the sweep range of each test parameter may include a sweep start point, a sweep end point, and a sweep offset point. A test parameter refers to an operation timing parameter of the memory core MC when the memory core MC is being tested. A test pattern Test_P may be generated by the test pattern generating unit 120 based on the test parameter. For example, when the memory core MC is a DRAM, the test parameter may be one of tRC (Row cycle time), tRAS (Rowactive time), tRP (Row precharge time), tRRD (Row active to Row active delay), tRCD (/RAS to /CAS delay), tCK (test Clock), VRef (Voltage Reference), Temp (Temperature), etc. According to an embodiment, the test pattern generating unit 120 may generate the test pattern Test_P in accordance with test parameters such as tRC (Row cycle time), tRAS (Rowactive time), etc. According to an embodiment, the test pattern generating unit 120 may generate a test pattern by using March C-algorithm. The test pattern Test_P may include reference data REF_DATA (e.g., a predetermined reference data), a test address, a test command, etc.

The BIST control logic 110 may control the test by repeatedly performing a plurality of test loops to sweep each test parameter. Such a test is referred to as a sweep test in an exemplary embodiment.

According to an exemplary embodiment, an nth test loop that performs the sweep test using an nth test parameter will now be described. The BIST control logic 110 may control the test pattern generating unit 120 to generate the test pattern Test_P based on the nth test parameter when the nth test parameter has the sweep start point. In this regard, test parameters other than the nth test parameter may be fixed to have a preset reference point during the nth test loop. However, the embodiment that the test parameters other than the nth test parameter are fixed to have the preset reference point is merely an exemplary embodiment. At least one of the test parameters other than the nth test parameter may be swept simultaneously with the nth test parameter to perform the sweep test. The nth test loop may be performed several times by changing the reference point of the test parameters other than the nth test parameter. For example, when an n+1th test parameter has a fixed first reference point, a comparison result may be generated by performing the nth test loop using the nth test parameter and another comparison result may be generated by performing the nth test loop again by changing the n+1th test parameter to have a fixed second reference point.

The test pattern generating unit 120 may provide the test pattern Test_P to the memory core MC. The comparing unit 130 may receive output data Dout corresponding to the nth test parameter of the sweep start point from the memory core MC and may compare the output data Dout and reference data REF_DATA received from the test pattern generating unit 120. The comparing unit 130 may generate a comparison result CR of the output data Dout and reference data REF_DATA and may provide the comparison result CR to the test result storing unit 140.

Thereafter, the BIST control logic 110 may control the test pattern generating unit 120 to generate the test pattern Test_P based on the nth test parameter when the nth test parameter has a sweep point next the sweep start point. The comparing unit 130 may generate another comparison result by using the generated test pattern Test_P and provide the comparison result to the test result storing unit 140. The BIST control logic 110 may repeat the nth test loop until the nth test parameter has the sweep end point and may store a plurality of comparison results generated through the nth test loop in the test result storing unit 140.

The BIST control logic 110 may control an n+1th test loop that performs the sweep test by using the n+1th test parameter after ending the nth test loop.

The test result storing unit 140 may receive test condition information TCI including test parameters selected from the BIST control logic 110, a sweep range of each test parameter, and sweep test progress status information, etc. The test result storing unit 140 may match the test condition information TCI and a stored comparison result to generate test result information TRI. For example, the test result storing unit 140 may match comparison results generated by performing the nth test loop and sweep points of the nth test parameter to generate nth test result information.

The test result storing unit 140 may provide a plurality of pieces of test result information TRI generated through a plurality of test loops to the outside (e.g., to a processor and a memory controller) and the BIST control logic 110. The BIST control logic 110 may control the sweep test on the memory core MC based on the test result information TRI. According to an embodiment, the parameter sweep control unit 115 may reset a sweep range of each test parameter based on the test result information TRI. The BIST control logic 110 may control the sweep test based on the reset sweep range.

The BIST circuit 100 according to one embodiment may automatically sweep test parameters to perform a sweep test, thereby promptly obtaining a plurality of pieces of test result information according to a point of each test parameter. The plurality of pieces of test result information may be used to set a sweep test priority when a next sweep test is performed on test parameters.

Figure 2:
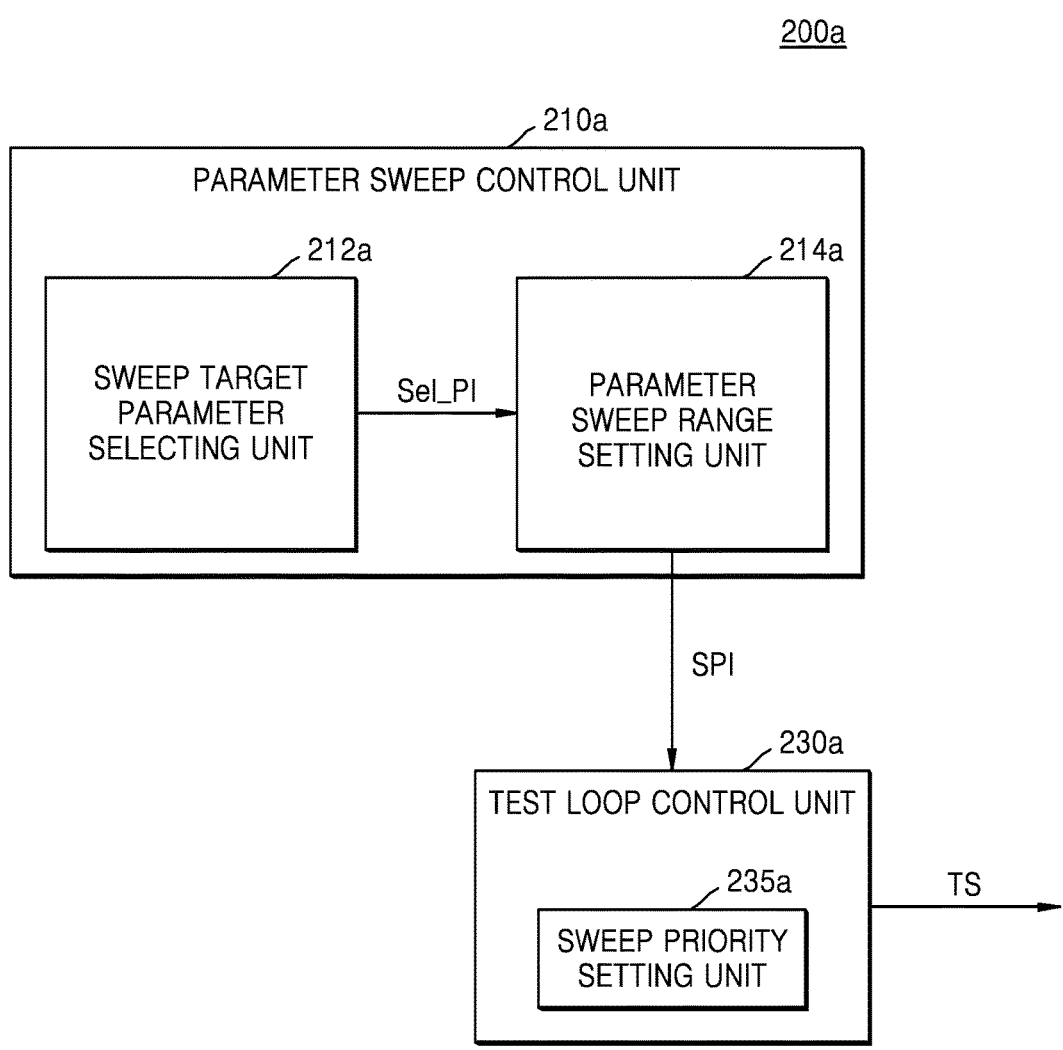
FIG. 2 is a block diagram of a BIST control logic according to an exemplary embodiment.

FIG. 2 is a block diagram of a BIST control logic 200a according to an exemplary embodiment. FIG. 3 is a diagram of sweep parameter information SPI for describing an operation of the BIST control logic 200a according to an exemplary embodiment.

As shown in FIG. 2, the BIST control logic 200a may include a parameter sweep control unit (e.g., a parameter sweep control circuit) 210a and a test loop control unit (e.g., a test loop control circuit) 230a. The parameter sweep control unit 210a may include a sweep target parameter selecting unit (e.g., a sweep target parameter selecting circuit) 212a and a parameter sweep range setting unit (e.g., a parameter sweep range setting circuit) 214a. The sweep target parameter selecting unit 212a may select at least one test parameter that is a sweep target from among a plurality of test parameters. The sweep target parameter selecting unit 212a may provide information Sel_PI regarding selected test parameters to the parameter sweep range setting unit 214a. The parameter sweep range setting unit 214a may set a sweep range of the selected test parameters. The parameter sweep range setting unit 214a may provide the sweep parameter information SPI including the sweep range of the selected test parameters to the test loop control unit 230a. The test loop control unit 230a may include a sweep priority setting unit (e.g., a sweep priority setting circuit) 235a. The sweep priority setting unit 235a may set a sweep test priority of the selected test parameters based on the sweep parameter information SPI. The test loop control unit 230a may control a sweep test using the selected test parameters based on the sweep test priority. An embodiment in this regard will now be described in detail below.

As shown in FIGS. 2 and 3, the sweep target parameter selecting unit 212a may select first through fourth test parameters that are sweep targets from among the plurality of test parameters. The parameter sweep range setting unit 214a may set a sweep range of each of the selected first through fourth test parameters. The first test parameter may have a sweep range of 5-10 clock units. The second test parameter may have a sweep range of 10-20 clock units. The third test parameter may have a sweep range of 20-25 clock units. The fourth test parameter may have a sweep range of 10-15 clock units. A clock unit may correspond to an internal test clock unit of the BIST circuit 100 of FIG. 1. A sweep start point of the first test parameter may correspond to 5 and a sweep end point thereof may correspond to 10. The parameter sweep range setting unit 214a may set sweep offset points of the first through fourth test parameters as 1. Thus, the first test parameter may be swept in an order of sweep points of 5, 6, 7, 8, 9, and 10. However, this is merely an exemplary embodiment. Sweep offset points may be variously set according to each test parameter. However, this is merely an exemplary embodiment and the inventive concept is not limited to the above embodiment. Various sweep ranges may be set by selecting various test parameters. For example, in some embodiments, the parameter sweep range setting unit 214a may set sweep offset points of the first through fourth test parameters as 2. In one exemplary embodiment, the second test parameter, for example, may be swept in an order of sweep points of 10, 12, 14, 16, 18, and 20.

The sweep priority setting unit 235a may set the sweep test priority in order of the first test parameter, the second test parameter, the third test parameter, and the fourth test parameter with respect to the selected first through fourth test parameters. The test loop control unit 230a may control to firstly perform a first test loop Loop 1 that performs a sweep test using the first test parameter and lastly perform a fourth test loop Loop 4 that performs a sweep test using the fourth test parameter based on the sweep test priority.

According to the embodiment, only some of a plurality of test parameters may be selected as sweep targets, and thus a memory core may be more promptly tested, and a sweep test priority may be set with respect to test parameters when a sweep test is performed, thereby firstly sweeping an important test parameter and performing the sweep test.

Figure 4:
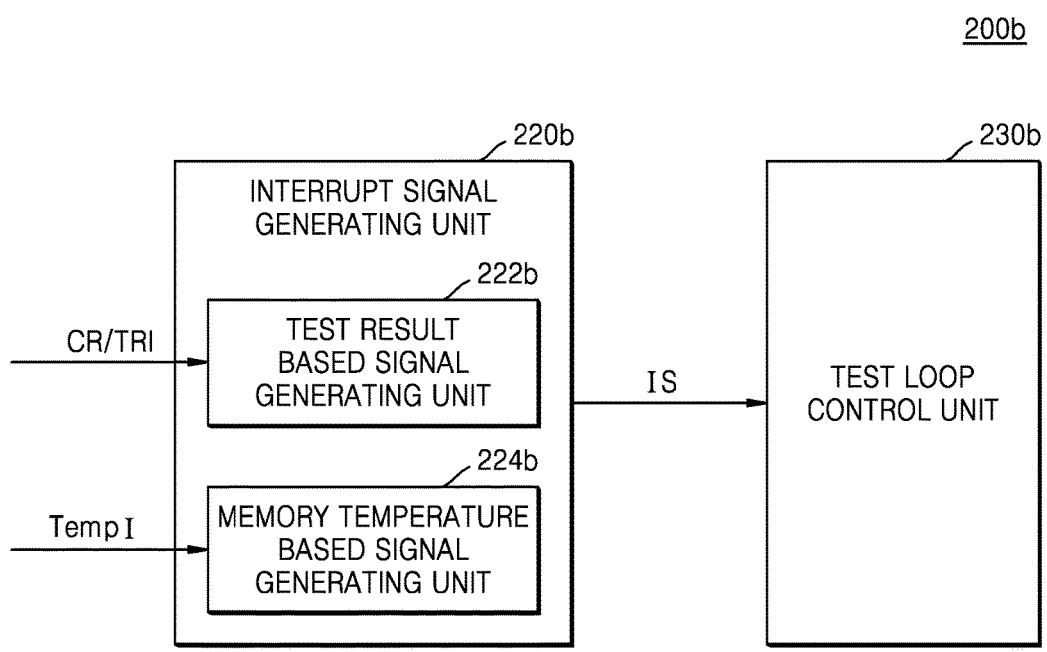
FIG. 4 is a block diagram of a BIST control logic according to another exemplary embodiment.
Figure 5B:
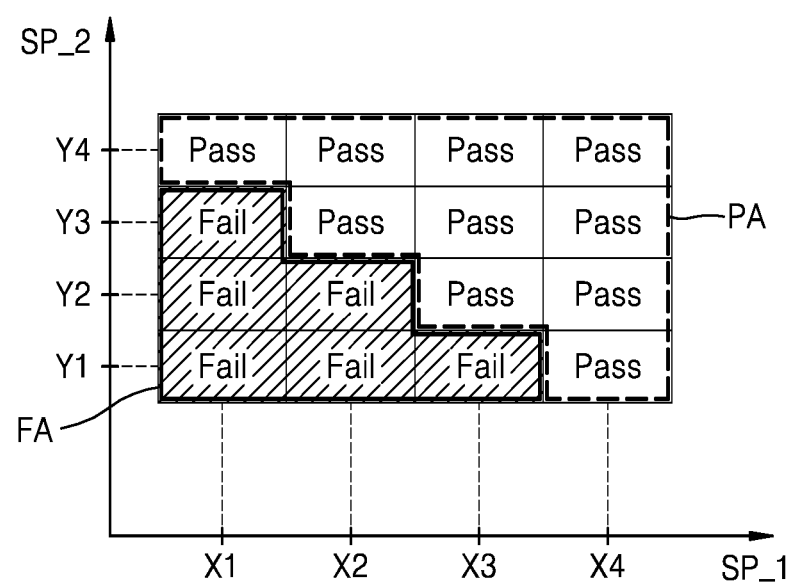

FIG. 4 is a block diagram of a BIST control logic 200b according to another exemplary embodiment. FIGS. 5A and 5B are diagrams for describing the test result information TRI generated through a sweep test according to an exemplary embodiment.

As shown in FIG. 4, the BIST control logic 200b may include an interrupt signal generating unit (e.g., an interrupt signal generating circuit) 220b and a test loop control unit (e.g., a test loop control circuit) 230b. The interrupt signal generating unit 220b may generate an interrupt signal IS that stops performing a test loop of the test loop control unit 230b. The interrupt signal generating unit 220b may include a test result based signal generating unit (e.g., a test result based signal generating circuit) 222b and a memory temperature based signal generating unit (a memory temperature based signal generating circuit) 224b.

The test result based signal generating unit 222b may receive the comparison result CR from the comparing unit 130 of FIG. 1 or may receive the plurality of test result information TRI from the test result storing unit 140 to generate the interrupt signal IS based on the comparison result CR or the test result information TRI. According to an embodiment, if the test loop control unit 230b performs the nth test loop using the nth test parameter, when a generated comparison result is changed from fail Fail to pass Pass, the test result based signal generating unit 222b may provide the interrupt signal IS to the test loop control unit 230b and control to stop performing the nth test loop. Thereafter, the test loop control unit 230b may control to instantaneously perform another test loop using another test parameter.

For example, as a result of performing a second test loop using a second test parameter SP_2 of FIG. 5A, when a comparison result firstly passes, the test result based signal generating unit 222b may control the test loop control unit 230b to stop performing the second test loop. Thereafter, the test loop control unit 230b may control to perform a third test loop using a third test parameter SP_3.

The memory temperature based signal generating unit 224b may receive temperature information TempI of a memory device including the BIST circuit 200b, may provide the interrupt signal IS to the test loop control unit 230b based on the temperature information TempI of the memory device, and may stop performing the test loop of the test loop control unit 230b. According to an embodiment, the memory temperature based signal generating unit 224b may compare the temperature information TempI of the memory device and reference temperature information, and, when the temperature information TempI of the memory device exceeds the reference temperature information, may stop performing the test loop of the test loop control unit 230b.

According to this exemplary embodiment, the BIST circuit 200b may instantly stop performing a test loop when it is difficult to perform the test loop since a temperature of a memory device exceeds a reference temperature, and when a desired comparison result or test result information is received by performing a test loop using a specific test parameter, may stop performing the specific test loop and may perform a test loop using a next test parameter, thereby performing an efficient sweep test.

Referring to FIGS. 3 and 5A, the first test parameter SP_1 may be used to perform a first test loop and generate first test result information TRI1. The first test result information TRI1 may include first through sixth comparison results $1^{st}$ RC-$6^{th}$ RC. The $1^{st}$ through $6^{th}$ comparison results $1^{st}$ RC-$6^{th}$ RC may respectively match sweep points of the first test parameter SP_1. For example, the first comparison result $1^{st}$ RC may match a $5^{th}$ sweep point of the first test parameter SP_1, the second comparison result $2^{nd}$ RC may match a $6^{th}$ sweep point of the first test parameter SP_1, the sixth comparison result $6^{th}$ RC may match a $10^{th}$ sweep point of the first test parameter SP_1, etc. Furthermore, the first test result information TRI1 may separately include tag information regarding a sweep point of the first test parameter SP_1 matching each comparison result. The first test result information TRI1 may include first margin information M1 regarding the first test parameter SP_1. Margin information may be information indicating sweep points of a test parameter matching a section in which a comparison result generated by performing a sweep test using a test parameter corresponds to the pass Pass. For example, the first margin information M1 may be information indicating a $2^{nd}$ sweep point through a $10^{th}$ sweep point of the first test parameter SP_1 matching the second through sixth comparison results $2^{nd}$ RC-$6^{th}$ RC.

The second test result information TRI2 may include $1^{st}$ through $11^{th}$ comparison results $1^{st}$ RC-$11^{th}$ RC. The second through $11^{th}$ comparison results $1^{st}$ RC-$6^{th}$ RC may respectively match sweep points of the second test parameter SP_2. For example, the first comparison result $1^{st}$ RC may match a $10^{th}$ sweep point of the second test parameter SP_2, the second comparison result $2^{nd}$ RC may match a $11^{th}$ sweep point of the second test parameter SP_2, the third comparison result $3^{rd}$ RC may match a $12^{th}$ sweep point of the second test parameter SP_2, the ninth comparison result $9^{th}$ RC may match a $18^{th}$ sweep point of the second test parameter SP_2, etc. The second test result information TRI2 may include second margin information M2 indicating a $12^{th}$ sweep point through a $20^{th}$ sweep point of the second test parameter SP_2.

The third test result information TRI3 may include the first through sixth comparison results $1^{st}$ RC-$11^{th}$ RC. The first through sixth comparison results $1^{st}$ RC-$6^{th}$ RC may respectively match sweep points of the third test parameter SP_3. For example, the first comparison result $1^{st}$ RC may match a $20^{th}$ sweep point of the third test parameter SP_3, the second comparison result $2^{nd}$ RC may match a $21^{st}$ sweep point of the third test parameter SP_3, the sixth comparison result $6^{th}$ RC may match a $25^{th}$ sweep point of the third test parameter SP_3, etc. The third test result information TRI3 may include third margin information M3 indicating a $24^{th}$ sweep point through a $25^{th}$ sweep point of the third test parameter SP_3.

The fourth test result information TRI4 may include the first through sixth comparison results $1^{st}$ RC-$11^{th}$ RC. The first through sixth comparison results $1^{st}$ RC-$6^{th}$ RC may respectively match sweep points of the fourth test parameter SP_4. For example, the first comparison result $1^{st}$ RC may match a $10^{th}$ sweep point of the fourth test parameter SP_4, the second comparison result $2^{nd}$ RC may match a $11^{th}$ sweep point of the fourth test parameter SP_4, the sixth comparison result $6^{th}$ RC may match a $15^{th}$ sweep point of the fourth test parameter SP_4, etc. The fourth test result information TRI4 may not include fourth margin information M4 since all the first through sixth comparison results $1^{st}$ RC-$6^{th}$ RC fail Fail.

According to an exemplary embodiment, the parameter sweep control unit 115 of FIG. 1 may receive the first through fourth test result information TRI1-TRI4 and may reset a sweep range of the fourth test parameter SP4 based on the first through fourth test result information TRI1-TRI4. For example, the parameter sweep control unit 115 may reset a sweep start point of the fourth test parameter SP4 as 16 and a sweep end point thereof as 21. The BIST control logic 110 may re-perform the fourth test loop Loop4 by using the fourth test parameter SP_4 based on the reset sweep range, thereby generating the fourth test result information TRI4 including the fourth margin information M4.

FIG. 5B is a diagram for generating a data format indicating test correlations between test parameters by using a plurality of pieces of test result information according to another exemplary embodiment. The test result storing unit 140 of FIG. 1 may generate the data format indicating the test correlations between the test parameters based on the plurality of pieces of test result information. According to this exemplary embodiment, the data format may correspond to a Shmoo data format.

Referring to FIG. 5B, a test correlation between the first test parameter SP_1 and the second test parameter SP_2 is illustrated. In some embodiments, the first test parameter SP_1 and the second test parameter SP_2 may refer to different types of measurements. For example, the first test parameter SP_1 may refer to temperature measurements and the second test parameter SP_2 may refer to voltage measurements when the memory core MC is being tested. In some embodiments, the first test parameter SP_1 and the second test parameter SP_2 may refer to different values of same type of measurement. For example, as discussed above, a test parameter refers to an operation timing parameter of the memory core MC when the memory core MC is being tested. Thus, the first test parameter SP_1 may refer to a first operation timing of the memory core MC when the memory core MC is being tested and the second test parameter SP_2 may refer to a second operation timing of the memory core MC when the memory core MC is being tested. A sweep range of the first test parameter SP_1 may be set as X1-X4. A sweep range of the second test parameter SP_2 may be set as Y1-Y4. The test result storing unit 140 of FIG. 1 may generate a data format indicating the test correlation between the first test parameter SP_1 and the second test parameter SP_2 based on first test result information generated by performing a first test loop using the first test parameter SP_1 and second test result information generated by performing a second test loop using the second test parameter SP_2. Accordingly, a test comparison result may be determined according to a sweep point of the first test parameter SP_1 and a sweep point of the second test parameter SP_2. Furthermore, the BIST control logic 110 of FIG. 1 may receive a data format indicating test correlations from the test result storing unit 140, may divide a fail area FA and a pass area PA through the data format, and may discover sweep points of ideal test parameters during a sweep test.

Figure 6:
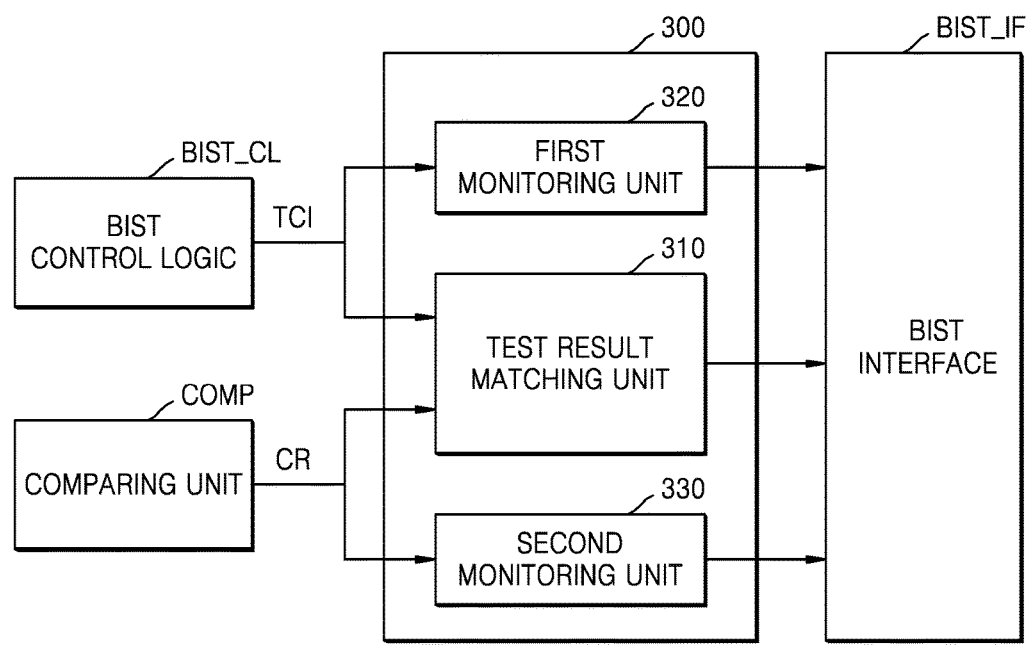
FIG. 6 is a block diagram of a test result storing unit according to an exemplary embodiment.

FIG. 6 is a block diagram of a test result storing unit (e.g., a test result storing circuit) 300 according to an exemplary embodiment.

As shown in FIG. 6, the test result storing unit 300 may include a test result matching unit (e.g., a test result matching circuit) 310, a first monitoring unit (e.g., a first monitoring circuit) 320, and a second monitoring unit (e.g., a second monitoring circuit) 330. The test result storing unit 300 may receive the test condition information TCI from a BIST control logic BIST_CL and may receive a comparing result from a comparing unit (e.g., a comparing circuit) COMP. The test condition information TCI may include related information such as a test parameter selected as a sweep target, a sweep range of each test parameter, a sweep test progress status, etc.

The first monitoring unit 320 may include a monitoring line connected to a BIST interface BIST_IF to provide the test condition information TCI received from the BIST control logic BIST_CL to the BIST interface BIST_IF in real time. The second monitoring unit 330 may include a monitoring line connected to the comparing unit COMP to provide the comparison result CR received from the comparing unit COMP to the BIST interface BIST_IF in real time. The test result storing unit 300 may provide the test condition information TCI and the comparison result CR to the outside (a memory controller, a processor, etc.) in real time through the BIST interface BIST_IF.

The test result matching unit 310 may match the test condition information TCI and the comparison result CR to generate test result information. For example, the test result matching unit 310 may match the comparison results CR generated by performing an nth test loop and sweep points of the nth test parameter included in the test condition information TCI to generate nth test result information. The test result matching unit 310 may store the test result information generated by matching the test condition information TCI and the comparison result CR in the test result storing unit 300 and may provide the test result information to the BIST interface BIST_IF. The test result storing unit 300 may provide the test result information to the outside (e.g., to a memory controller, a processor, etc.) through the BIST interface BIST_IF.

Figure 7:
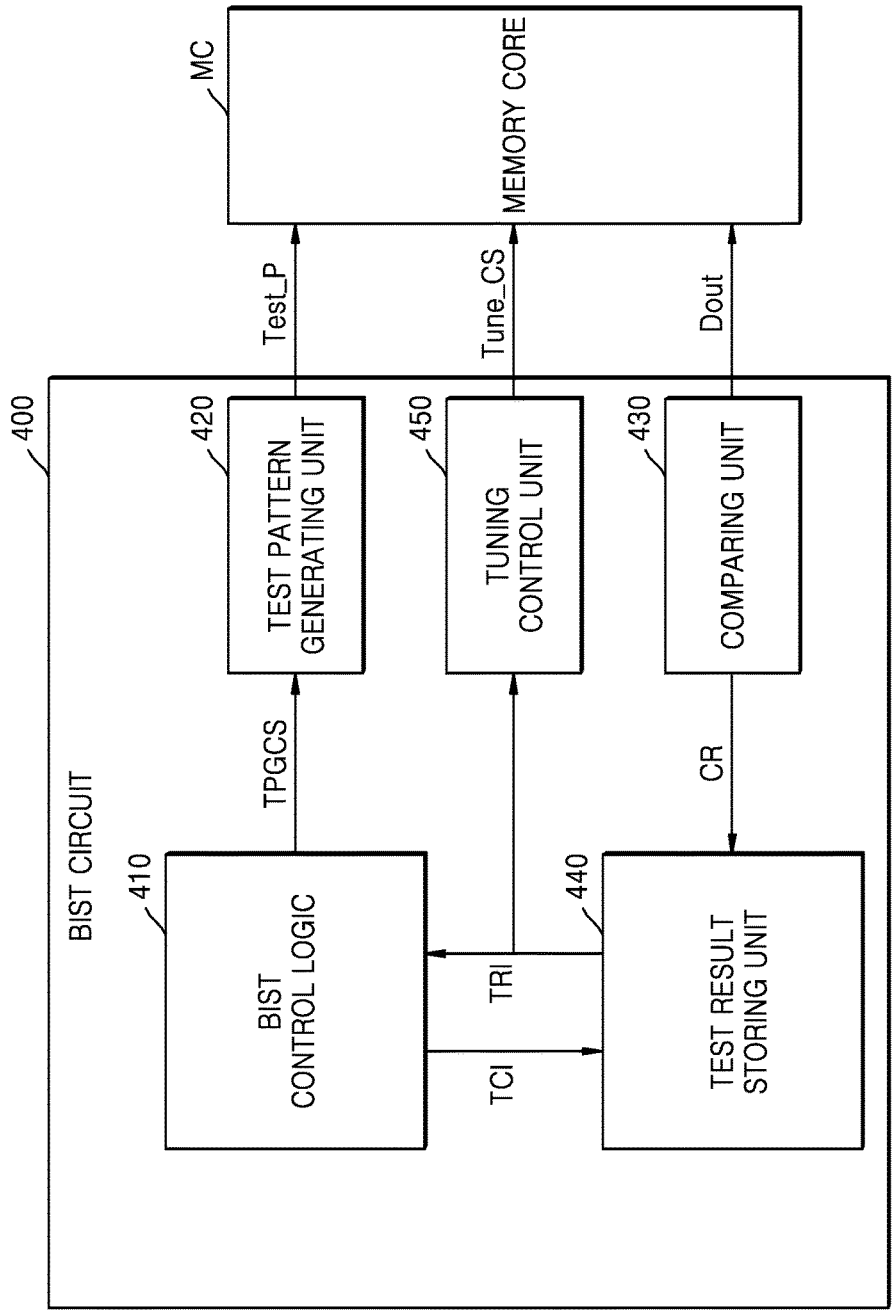
FIG. 7 is a block diagram of a BIST circuit according to another exemplary embodiment.

FIG. 7 is a block diagram of a BIST circuit 400 according to another exemplary embodiment.

As shown in FIG. 7, the BIST circuit 400 may correspond to the BIST circuit 100 of FIG. 1, except that the BIST circuit 400 further includes a tuning control unit (e.g., a tuning control circuit) 450. The tuning control unit 450 included in the BIST circuit 400 will now be described below.

The tuning control unit 450 may receive the plurality of pieces of test result information TRI from a test result storing unit 40. The tuning control unit 450 may provide a tuning control signal Tune_CS to the memory core MC based on the plurality of pieces of test result information TRI and may tune a memory characteristic of the memory core MC. The memory characteristic may include an operating timing characteristic of the memory core MC, input and output characteristics, and a voltage characteristic of the memory core MC. The tuning control unit 450 may tune at least one of the operating timing characteristic of the memory core MC, the input and output characteristics, and the voltage characteristic of the memory core MC. However, for convenience of description, the tuning control signal Tune_CS is provided to the memory core MC but the inventive concept is not limited thereto. The tuning control signal Tune_CS may be provided to a control logic capable of tuning the memory characteristic or a fuse area including a plurality of fuses, etc.

Methods of tuning the memory characteristic of the memory core MC will now be described below. According to an exemplary embodiment, a memory device including the BIST circuit 400 and the memory core MC may further include the fuse area including the plurality of fuses determining the memory characteristic of the memory core MC or a control logic capable of setting a mode register set. The tuning control unit 450 may select and self-fuse some fuses of the fuse area, thereby tuning the memory characteristic of the memory core MC. The tuning control unit 450 may set the mode register set corresponding to the memory characteristic of the memory core MC in the control logic to allow the memory core MC to operate based on the mode register set, thereby tuning the memory characteristic of the memory core MC.

Therefore, the BIST circuit 400 may not only test an operation of the memory core MC but also efficiently tune the memory characteristic of the memory core MC based on a test parameter corresponding to each test result.

Figure 8:
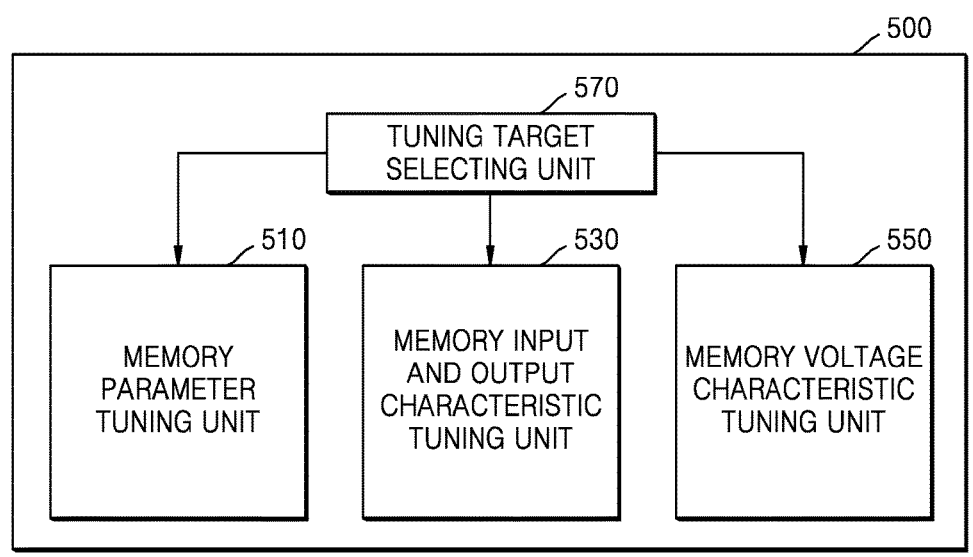
FIG. 8 is a block diagram of a tuning control unit according to an exemplary embodiment.

FIG. 8 is a block diagram of a tuning control unit 500 according to an exemplary embodiment.

As shown in FIG. 8, the tuning control unit 500 may include a memory parameter tuning unit 510, a memory input and output characteristic tuning unit 530, a memory voltage characteristic tuning unit 550, and a tuning target selecting unit 570.

The memory parameter tuning unit 510 may tune an operating timing parameter of the memory core MC of FIG. 7 based on test result information. When the memory core MC is DRAM, the operating timing parameter may correspond to one of tRC (Row cycle time), tRAS (Row active time), tRP (Row precharge time), tRRD (Row active to Row active delay), tRCD (/RAS to /CAS delay), tCK (test Clock), VRef (Voltage Reference), Temp (Temperature), etc. According to an embodiment, the memory parameter tuning unit 510 may tune points of the operating timing parameter of the memory core MC of FIG. 7 in the same way as points of a test parameter when all comparison results pass based on the test result information.

The memory input and output characteristic tuning unit 530 may tune a size of an input and output driver of the memory core MC of FIG. 7 based on the test result information or may tune a level of a reference voltage provided to the memory core MC based on the test result information, thereby tuning the input and output characteristics of the memory core MC. The memory voltage characteristic tuning unit 550 may tune a level of an external voltage applied to the memory device including the memory core MC based on the test result information, thereby tuning voltage characteristic of the memory core MC. However, this is an exemplary embodiment and the inventive concept is not limited thereto. The tuning control unit 500 may tune the memory characteristic of the memory core MC in various ways.

The tuning target selecting unit 570 may select a method of tuning the memory characteristic of the memory core MC. The tuning target selecting unit 570 may select at least one of the memory parameter tuning unit 510, the memory input and output characteristic tuning unit 530, and the memory voltage characteristic tuning unit 550 to tune the memory characteristic of the memory core MC.

Figure 9:
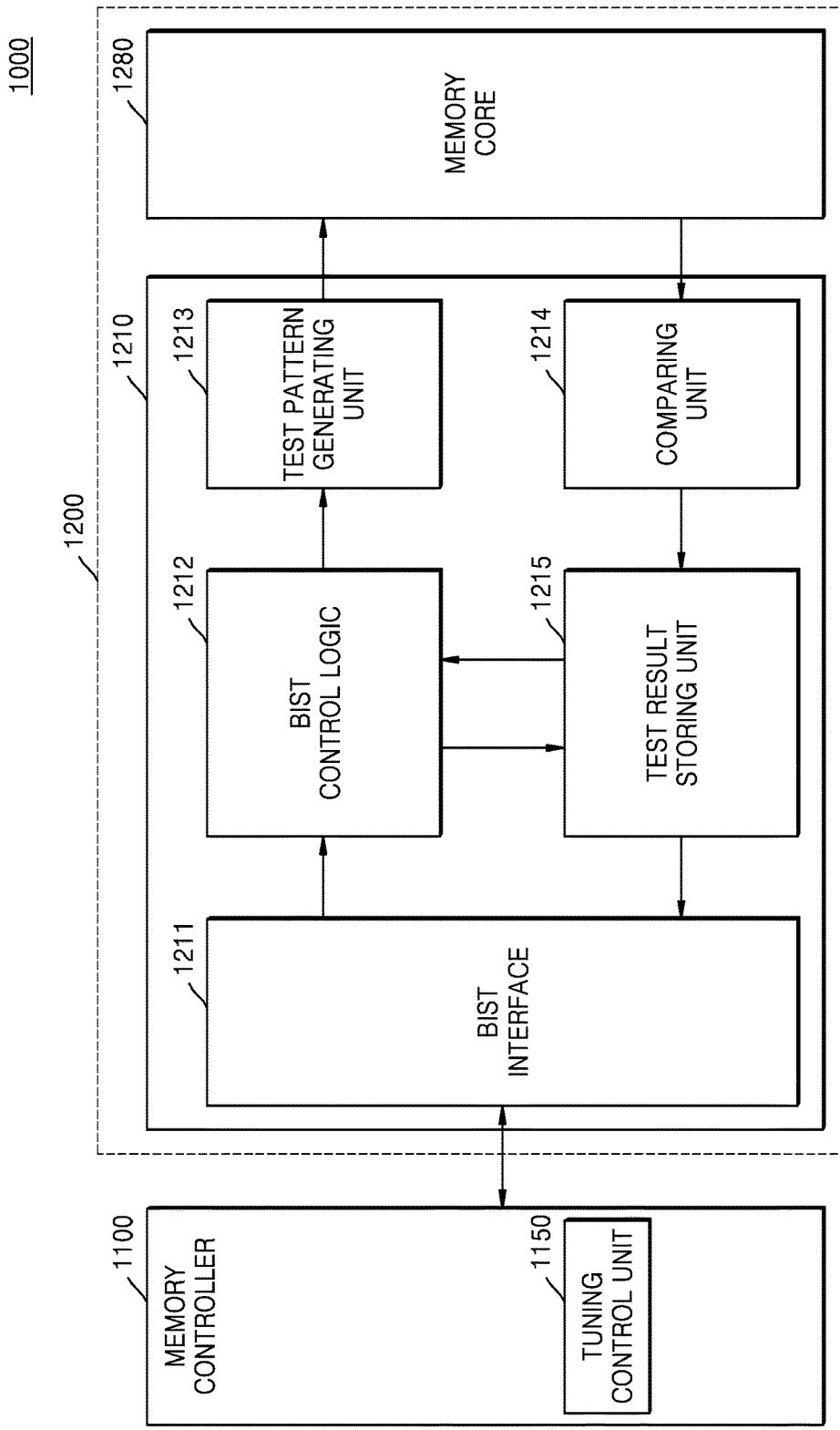
FIG. 9 is a block diagram of a memory system according to an exemplary embodiment.

FIG. 9 is a block diagram of a memory system 1000 according to an exemplary embodiment.

As shown in FIG. 9, the memory system 1000 may include a memory controller 1100 and a memory device 1200. The memory device 1200 may include a BIST circuit 1210 and a memory core 1280. The BIST circuit 1210 may include a BIST interface 1211, a BIST control logic 1212, a test pattern generating unit 1213, a comparing unit 1214, and a test result storing unit 1215. As described above, the BIST circuit 1210 may perform a sweep test on the memory core 1280. A plurality of pieces of test result information generated by performing the sweep test may be provided to the memory controller 1100 through the BIST interface 1211. According to an embodiment, the BIST interface 1211 may be a general interface interfacing with a processor and may be configured as a standard interface such as the JTAG (Joint Test Action Group), IEEE 1500, etc.

The memory controller 1100 may include a tuning control unit 1150. The tuning control unit 1150 may correspond to the tuning control unit 450 of FIG. 7 or the tuning control unit 500 of FIG. 8. The tuning control unit 1150 may provide the tuning control signal Tune_CS to the memory core 1280 based on the plurality of pieces of test result information and may tune a memory characteristic of the memory core 1280. However, this is an exemplary embodiment. The tuning control unit 1150 may be a separate device that is not included in the memory controller 1100 and is controlled by the memory controller 1100. In this case, the memory controller 1100 may control the tuning control unit 1150 based on the plurality of pieces of test result information received from the BIST circuit 1210 to tune the memory characteristic of the memory core 1280. The memory characteristic of the memory core 1280 may be tuned according to various embodiments in which the memory characteristic of the memory core 1280 is tuned through the BIST interface 1211.

Methods of tuning the memory characteristic of the memory core 1280 will now be described below. According to an exemplary embodiment, the memory device 1200 may further include a fuse area including a plurality of fuses determining the memory characteristic of the memory core 1280 or a control logic capable of setting a mode register set. Under control of the memory controller 1100, the tuning control unit 1150 may select and self-fuse some fuses of the fuse area, thereby tuning the memory characteristic of the memory core 1280. The tuning control unit 1150 may set the mode register set corresponding to the memory characteristic of the memory core 1280 in the control logic to allow the memory core 1280 to operate based on the mode register set, thereby tuning the memory characteristic of the memory core 1280.

Figure 10A:
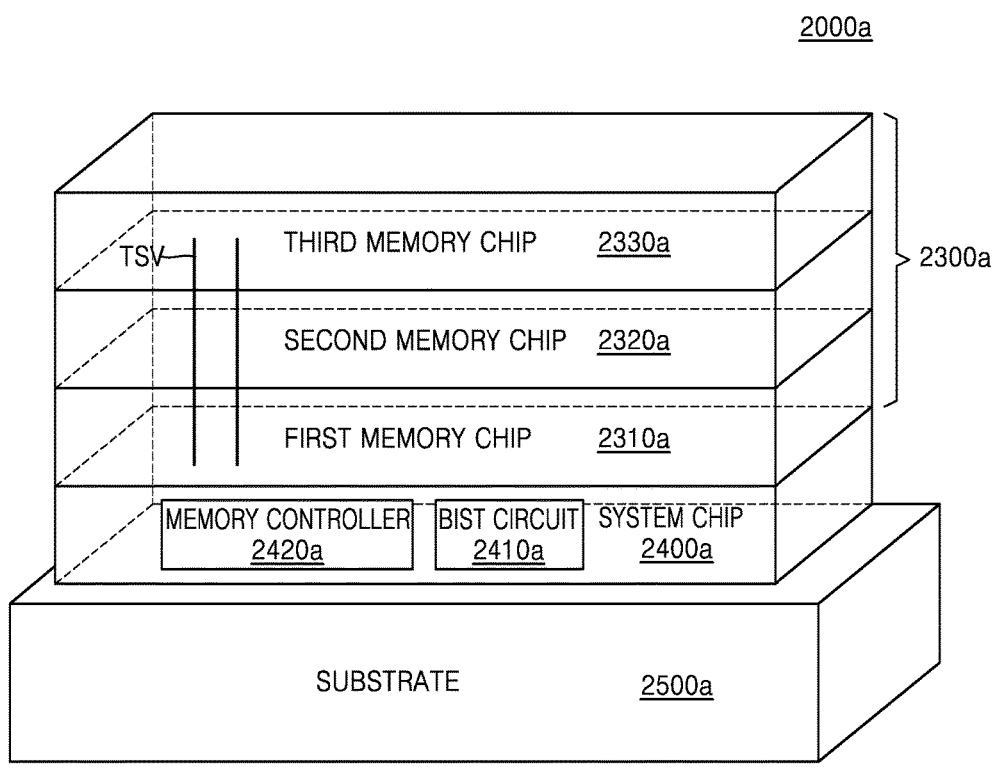
FIGS. 10A and 10B are diagrams of a stack memory device according to another exemplary embodiment.
Figure 10B:
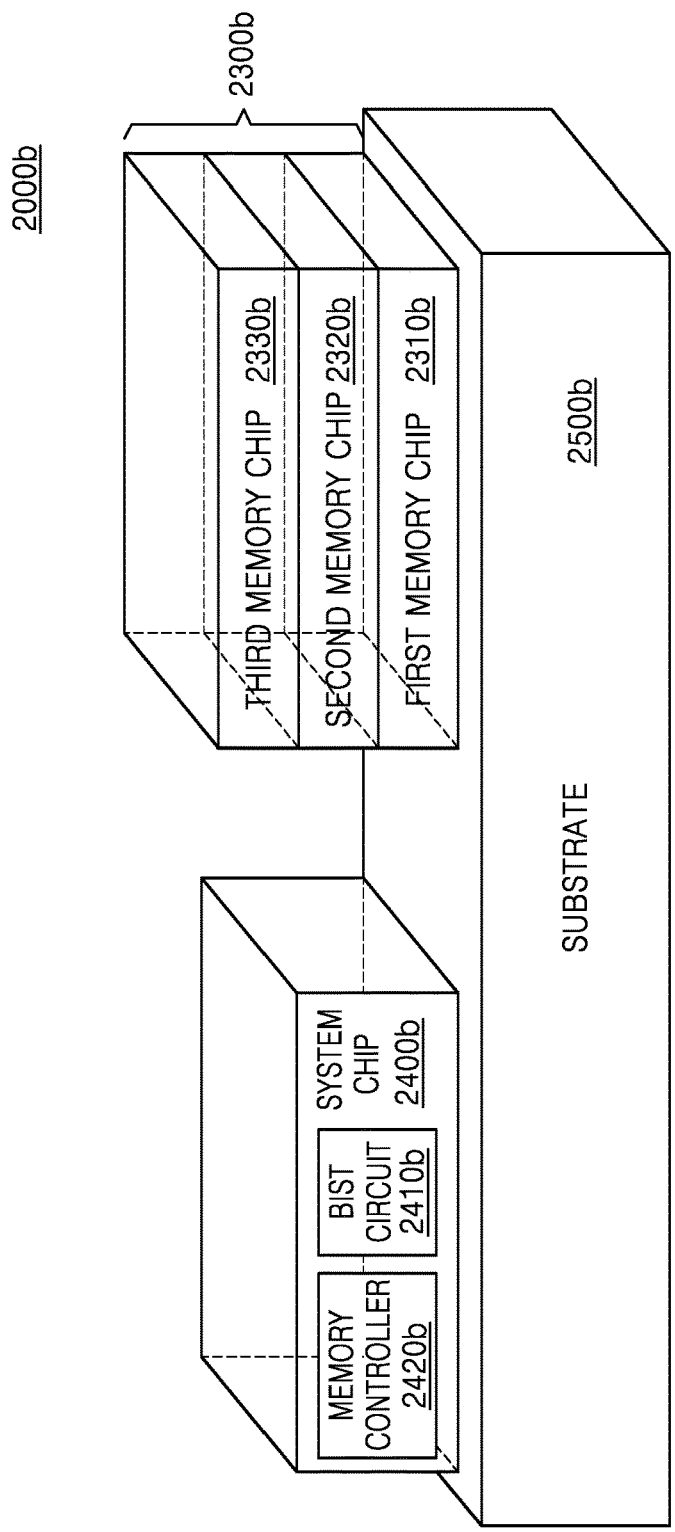

FIGS. 10A and 10B are diagrams of a stack memory device 2000a according to another exemplary embodiment.

As shown in FIG. 10A, the stack memory device 2000a may include a system chip 2400a stacked on a substrate 2500a and a plurality of memory chips 2300a stacked on the system chip 2400a. According to an embodiment, the plurality of memory chips 2300a may include a first memory chip 2310a, a second memory chip 2320a, and a third memory chip 2330a. However, this is an exemplary embodiment and the inventive concept is not limited thereto. Various numbers of stacked memory chips may be included in the stack memory device 2000a. The system chip 2400a may provide various commands, addresses, and data signals to each of the memory chips 2310a-2330a through a plurality of through silicon vias (TSVs) to control each of the memory chips 2310a-2330a.

The system chip 2400a may include a memory controller 2420a and a BIST circuit 2410a. The memory controller 2420a may enable the BIST circuit 2410a to perform a sweep test on the plurality of memory chips 2300a. According to an exemplary embodiment, the BIST circuit 2410a may perform the sweep test on the first through third memory chips 2310a-2330a. Accordingly, the BIST circuit 2410a may generate test result information of each of the first through third memory chips 2310a-2330a. The BIST circuit 2410a may tune a memory characteristic of the first memory chip 2310a based on the test result information of the first memory chip 2310a, tune a memory characteristic of the second memory chip 2320a based on the test result information of the second memory chip 2320a, and tune a memory characteristic of the third memory chip 2330a based on the test result information of the third memory chip 2330a.

According to an exemplary embodiment, the BIST circuit 2410a may tune at least one of an operating timing parameter of each of the first through third memory chips 2310a-2330a, input and output characteristics thereof, and a voltage characteristic thereof based on the plurality of pieces of test result information in order to tune the memory characteristic of each of the first through third memory chips 2310a-2330a. The BIST circuit 2410a may tune the memory characteristic of each of the first through third memory chips 2310a-2330a based on the test result information of each of the first through third memory chips 2310a-2330a. According to an exemplary embodiment, the BIST circuit 2410a may detect an operating status deterioration degree of each of the plurality of memory chips 2300a. For example, the BIST circuit 2410a may detect a memory chip (hereinafter referred to as the first memory chip 2310a) having a most deteriorated operating status from among the first through third memory chips 2310a-2330a. The BIST circuit 2410a may tune the memory characteristic of the detected first memory chip 2310a based on the test result information of each of the first through third memory chips 2310a-2330a and may tune the memory characteristics of the second and third memory chips 2320a and 2330a in the same way as the memory characteristic of the detected first memory chip 2310a.

Furthermore, the BIST circuit 2410a may select at least one of the plurality of memory chips 2300a and may perform a sweep test only on the selected memory chip. According to an embodiment, the BIST circuit 2410a may select the first memory chip 2310a most adjacent to the substrate 2500a and may perform the sweep test on the first memory chip 2310a. The BIST circuit 2410a may generate the test result information of the first memory chip 2310a and may tune the memory characteristics of the second and third memory chips 2320a and 2330a in the same way as the memory characteristics of the first through third memory chips 2310a-2330a based on the test result information of the first memory chip 2310a.

However, this is an exemplary embodiment. As described above, the memory controller 2420a may receive the test result information from the BIST circuit 2410a and may tune the memory characteristic of each of the plurality of memory chips 2300a. In addition, various methods may be applied.

As shown in FIG. 10B, the stack memory device 2300b may include a system chip 2400b and a plurality of memory chips 2300b. Unlike FIG. 10A, the system chip 2400b and the plurality of memory chips 2300b may be separately stacked on the substrate 2500b. However, operations of elements are the same as described above, and thus detailed descriptions thereof are omitted.

Figure 11:
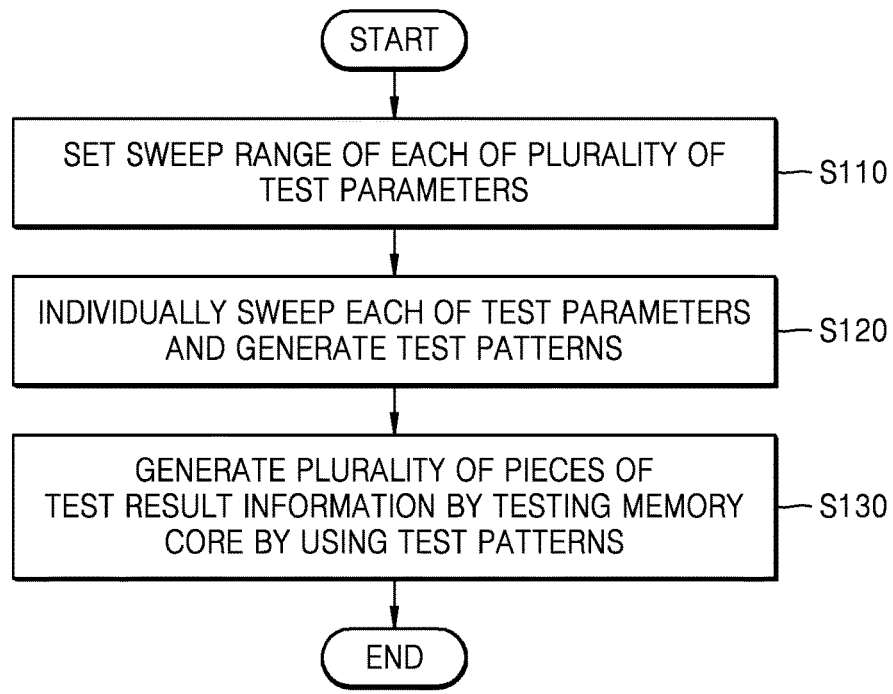
FIG. 11 is a flowchart for describing a method of operating a BIST circuit according to an exemplary embodiment.

FIG. 11 is a flowchart for describing a method of operating a BIST circuit according to an exemplary embodiment.

Referring to FIG. 11, the BIST circuit may set a sweep range of each of a plurality of test parameters (operation S110). The BIST circuit may individually sweep each of the plurality of test parameters based on the set sweep range and may generate test patterns (operation S120). The BIST circuit may test a memory core by using the test patterns to generate a plurality of pieces of test result information (operation S130). The BIST circuit may provide the plurality of pieces of test result information to a memory controller, a processor, etc. through a BIST interface.

Figure 12:
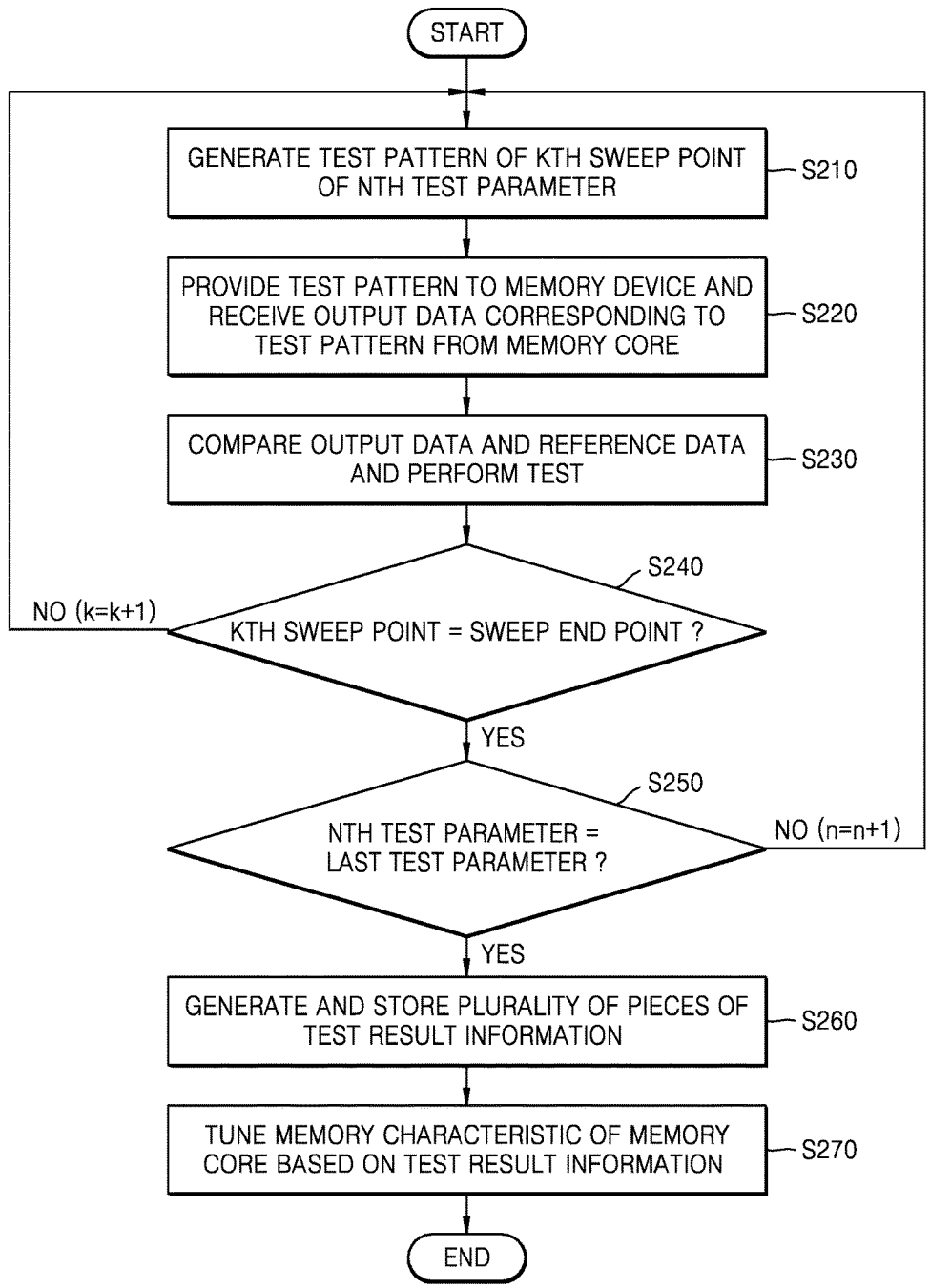
FIG. 12 is a detailed flowchart for describing a method of operating a BIST circuit according to another exemplary embodiment.

FIG. 12 is a detailed flowchart for describing a method of operating a BIST circuit according to another exemplary embodiment.

Referring to FIG. 12, the BIST circuit may generate a test pattern at a kth sweep point of an nth test parameter (operation S210). The BIST circuit may provide the test pattern to a memory core and may receive output data corresponding to the test pattern from the memory core (operation S220). The BIST circuit may perform a test of comparing the output data and reference data and may generate a comparison result (operation S230). The BIST circuit may determine whether the kth sweep point is a sweep end point (operation S240). When the kth sweep point is not the sweep end point (operation S240, NO), the BIST circuit may perform operations S210 through S230 by using the nth test parameter having a k+1th test point next to the kth sweep point. When the kth sweep point is the sweep end point (operation S240, YES), the BIST circuit may determine whether the nth test parameter is a last test parameter on which the sweep test is performed (operation S250). When the nth test parameter is not the last test parameter (operation S250, NO), the BIST circuit may perform operations S210 through S240 by using an n+1th test parameter next to the nth test parameter. When the nth test parameter is the last test parameter (operation S250, YES), the BIST circuit may generate and store a plurality of pieces of test result information by using generated comparison results (operation S260). The BIST circuit may tune a memory characteristic of the memory core based on the plurality of pieces of test result information (operation S270).

Figure 13:
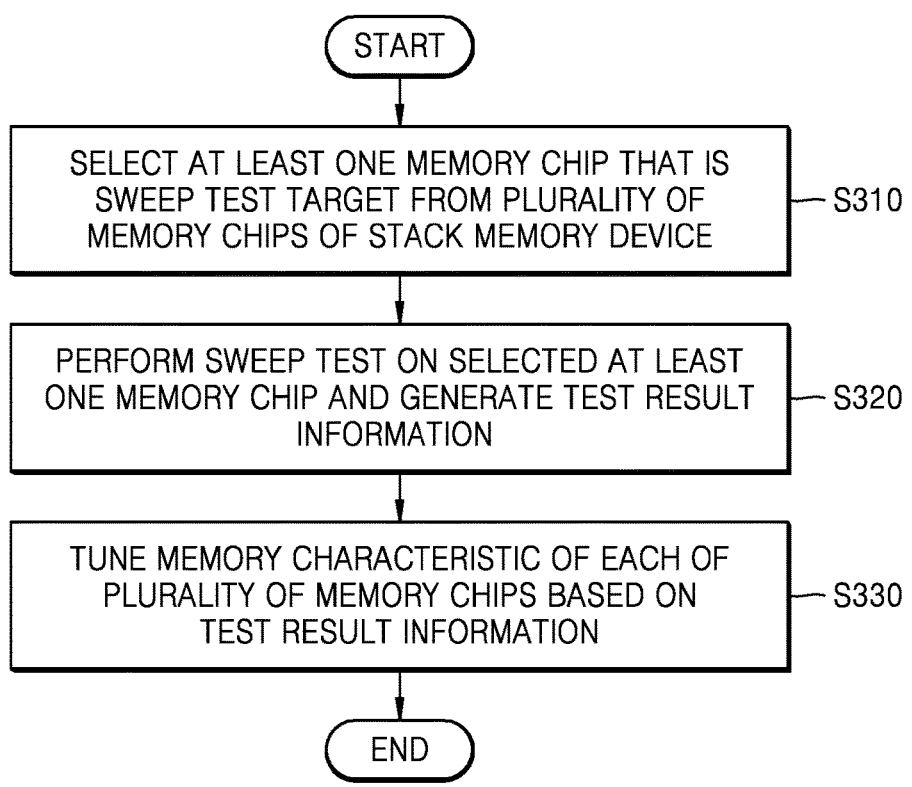
FIG. 13 is a flowchart of a method of operating a BIST circuit related to a stack memory device according to an exemplary embodiment.

FIG. 13 is a flowchart for describing a method of operating a BIST circuit relating to a stack memory device according to an exemplary embodiment.

The BIST circuit may select at least one memory chips that are sweep test targets from among a plurality of memory chips of the stack memory device (operation S310). The BIST circuit may perform a sweep test on the selected memory chip to generate test result information (operation S320). The BIST circuit may tune a memory characteristic of each of the plurality of memory chips based on the test result information (operation S320). Furthermore, the BIST circuit may tune the memory characteristic of each of the plurality of memory chips in the same way.

Figure 14:
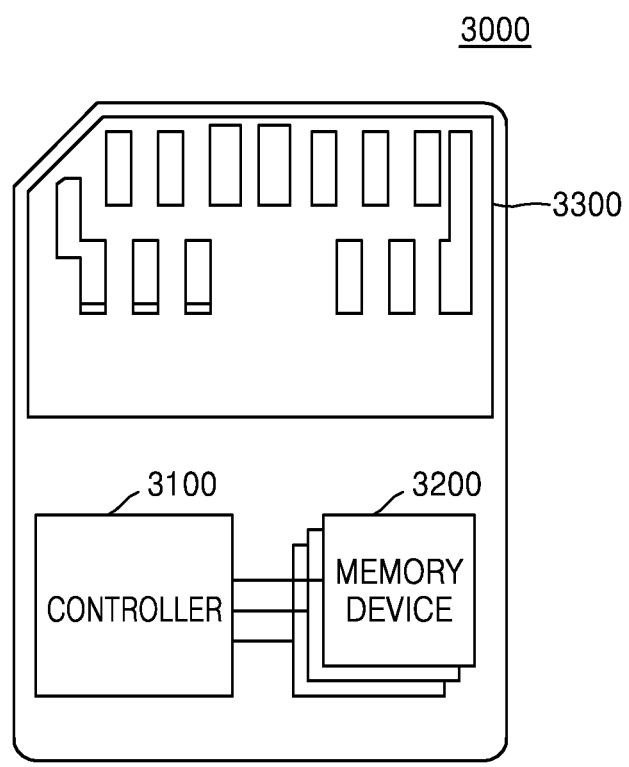
FIG. 14 is a diagram of a memory card according to an exemplary embodiment.

FIG. 14 is a diagram of a memory card 3000 according to an embodiment.

Referring to FIG. 14, the memory card 3000 may be a portable storage device that may be used by being connected to an electronic device such as mobile device or a desk top computer. As shown in FIG. 14, the memory card 3000 may include a memory controller 3100, a memory device 3200, and a port area 3300.

The memory card 3000 may communicate with an external host (not shown) through the port area 3300. The memory controller 3100 may control the memory device 3200. The memory controller 3100 may read and execute a program from a ROM (not shown) storing the program. The memory device 3200 may include the BIST circuit described with reference to FIGS. 1 through 13 and may perform a sweep test on a memory core of the memory device 3200 or memory chips thereof.

Figure 15:
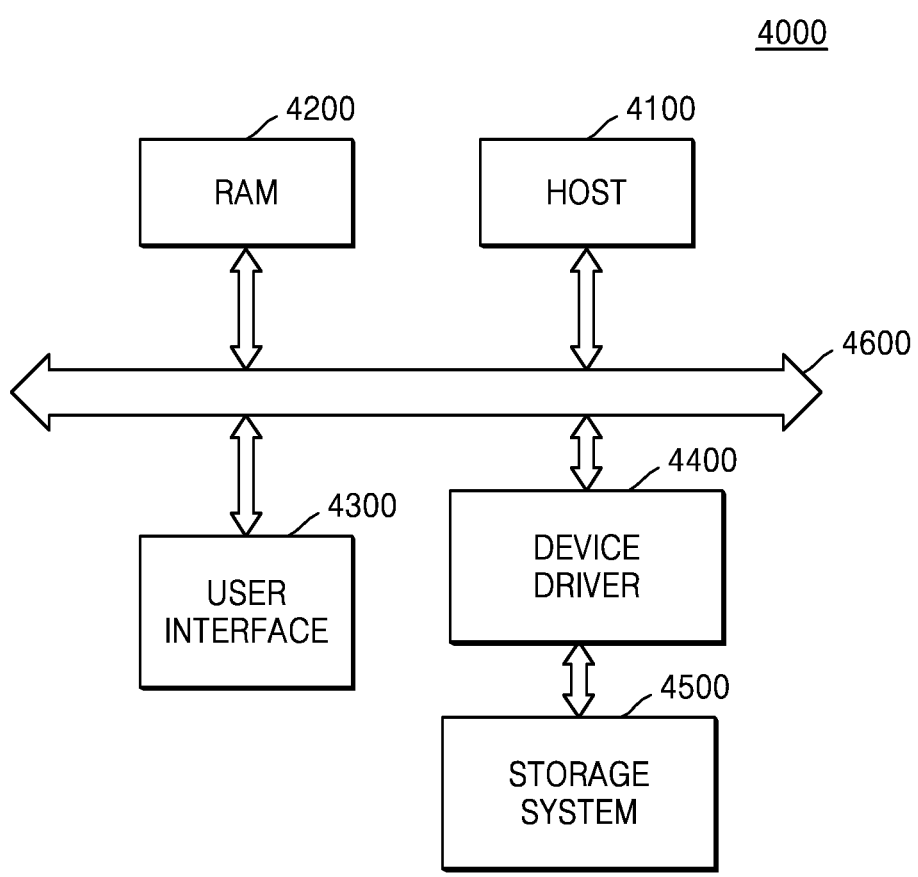
FIG. 15 is a block diagram of a computing system including a memory system according to an exemplary embodiment.

FIG. 15 is a block diagram of a computing system 4000 including a storage system 4500 according to an exemplary embodiment.

Referring to FIG. 15, the computing system 4000 may be a mobile device or a desk top computer and may include a host 4100 including a CPU, etc., a RAM 4200, a user interface 4300, and a device driver 4400. These elements may be electrically connected to a bus 4600. The storage system 4500 may be connected to the device driver 4400.

The host 4100 may control the computing system 4000 and may perform an arithmetic operation corresponding to a user command that is input through the user interface 4300. The RAM 4200 may function as a data memory of the host 4100. The host 4100 may record or read user data to or from the storage system 4500 through the device driver 4400. The memory device included in the storage system 4500 may include the BIST circuit described with reference to FIGS. 1 through 13 and may perform a sweep test on a memory core of the memory device or memory chips thereof.

While the inventive concept has been particularly shown and described with reference to embodiments thereof, it will be understood that various changes in form and details may be made therein without departing from the spirit and scope of the following claims.

What is claimed is:

1. A method of operating a built-in self-test (BIST) circuit configured to generate a test pattern based on a plurality of test parameters including a first test parameter and a second test parameter and perform a test on at least one memory core, the method comprising:
setting a sweep range comprising a sweep start point of the first test parameter, a sweep end point of the first test parameter, and a sweep offset point of the first test parameter;
generating a first test pattern corresponding to each sweep point of the sweep range from the sweep start point of the first test parameter and the sweep end point of the first test parameter based on the sweep offset point of the first test parameter and providing the first test pattern to the at least one memory core;
receiving output data corresponding to the first test pattern from the at least one memory core and comparing the output data and a predetermined reference data;
generating first test result information based on results of the comparing; and
resetting the sweep range of the first test parameter by resetting either the sweep start point of the first test parameter, the sweep end point of the first test parameter, or the sweep offset point of the first test parameter based on the first test result information for a subsequent test.

2. The method of claim 1, further comprising:
setting a sweep range comprising a sweep start point of the second test parameter, a sweep end point of the second test parameter, and a sweep offset point of the second test parameter;
generating a second test pattern corresponding to each sweep point of the sweep range from the sweep start point of the second test parameter and the sweep end point of the second test parameter based on the sweep offset point of the second test parameter and providing the second test pattern to the at least one memory core;
receiving output data corresponding to the second test pattern from the at least one memory core and comparing the output data and the predetermined reference data; and
generating second test result information based on results of the comparing.

3. The method of claim 2, further comprising: selecting the first test parameter and the second test parameter as sweep target parameters from among a plurality of test parameters for generating the corresponding test pattern.

4. The method of claim 3, further comprising: setting a sweep test priority for performing a sweep test with respect to the first test parameter and the second test parameter selected as the sweep target parameters.

5. The method of claim 2, further comprising: generating a data format indicating a test correlation between the first test parameter and the second test parameter based on at least one of the first test result information and the second test result information.

6. The method of claim 1, wherein when results of the comparing included in the first test result information are all fails, the sweep range of the first test parameter is reset to perform the test on the at least one memory core.

7. The method of claim 1, further comprising: generating an interrupt signal for stopping the test on the at least one memory core based on at least one of internal temperature information of a memory device including the at least memory core and the first test result information.

8. The method of claim 1, wherein the first test result information is generated by matching sweep points of the first test parameter and the results of the comparing corresponding to each sweep point of the first test parameter.

9. The method of claim 1, wherein the first test result information includes a first tag information indicating sweep points of the first test parameter matching a section in which the comparison result generated by performing the test on said at least one memory core by using the first test parameter corresponds to a pass.

10. The method of claim 1, wherein at least one test parameter, from among the plurality of test parameters other than the first test parameter, is swept simultaneously with the first test parameter to perform the test on said at least one memory core.

11. A method of operating a BIST circuit configured to repeatedly perform a plurality of test loops for performing a sweep test on at least one memory chip, the method comprising:
generating a test pattern by sweeping at least one test parameter based on a sweep range corresponding to at least one of a plurality of test parameters, wherein at least one of the plurality of test loops performs the step of generating said test pattern and wherein the sweep range includes a sweep start point, a sweep end point, and a sweep offset point of the at least one test parameter;
generating test result information by testing the at least one memory chip by using the test pattern, wherein at least one of the plurality of test loops performs the step of generating said test result information;

tuning a memory characteristic of the at least one memory chip based on a plurality of pieces of test result information generated through the plurality of test loops, wherein at least one of the plurality of test loops performs the step of tuning said memory characteristic; and resetting the sweep range of the at least one test parameter by resetting either the sweep start point of the at least one test parameter, the sweep end point of the at least one test parameter, or the sweep offset point of the at least one test parameter based on the first test result information for a subsequent test.

12. The method of claim 11, wherein the tuning of the memory characteristic of the at least one memory chip comprises: tuning at least one of an operating timing characteristic of the at least one memory chip, input and output characteristics of the at least one memory chip, and a voltage characteristic of the at least one memory chip based on the plurality of pieces of test result information.

13. The method of claim 11, wherein the BIST circuit performs the sweep test on a stack memory device comprising a plurality of memory chips.

14. The method of claim 13, further comprising:

generating a plurality of pieces of memory chip test result information respectively corresponding to the plurality of memory chips by performing the sweep test on each of the plurality of memory chips; and tuning a memory characteristic of each of the plurality of memory chips based on the plurality of pieces of memory chip test result information.

15. The method of claim 13, further comprising:

selecting at least one memory chip that is a target of the sweep test from the plurality of memory chips;

performing the sweep test on the selected at least one memory chip and generating test result information corresponding to the selected at least one memory chip; and tuning a memory characteristic of each of the plurality of memory chips in a same way based on the test result information corresponding to the selected at least one memory chip.

16. The method of claim 11, wherein the tuning of the memory characteristic of the at least one memory chip comprises: controlling a fuse area determining the memory characteristic of the at least one memory chip or setting a mode register set of the at least one memory chip.

17. A built-in self-test (BIST) circuit configured to generate a test pattern based on a plurality of test parameters including a first test parameter and a second test parameter and perform a test on at least one memory core, the BIST circuit comprising:

a control circuit configured to set a sweep range comprising a sweep start point of the first test parameter, a sweep end point of the first test parameter, and a sweep offset point of the first test parameter;

a pattern generating circuit configured to generate a first test pattern corresponding to each sweep point of the sweep range from the sweep start point of the first test parameter and the sweep end point of the first test parameter based on the sweep offset point of the first test parameter and configured to provide the first test pattern to the at least one memory core;

a comparing circuit configured to receive output data corresponding to the first test pattern from the at least one memory core and configured to compare the output data received from the at least one memory core and a predetermined reference data received from the pattern generating circuit in order to generate a comparison result;

a storage circuit configured to generate first test result information based on the comparison result received from the comparing circuit; and wherein the control circuit is configured to reset the sweep range of the first test parameter by resetting either the sweep start point of the first test parameter, the sweep end point of the first test parameter, or the sweep offset point of the first test parameter based on the first test result information for a subsequent test.

18. The BIST circuit of claim 17, wherein the first test result information includes a first tag information indicating sweep points of the first test parameter matching a section in which the comparison result generated by the comparing circuit corresponds to a pass.

19. The BIST circuit of claim 17, wherein the control circuit is configured to sweep at least one test parameter, from among the plurality of test parameters other than the first test parameter, simultaneously with the first test parameter to perform the test on said at least one memory core.

* * * * *